United States Patent [19]

Okamoto et al.

[11] Patent Number: 4,982,495

[45] Date of Patent: Jan. 8, 1991

[54] PROCESS FOR PRODUCING A CARRIER TAPE

[75] Inventors: Masamitsu Okamoto, Yokohamashi; Masami Wada, Yokosuka; Hidenori Funikawa, Ichiharashi; Haruo Kato, Yokohamashi; Hideaki Shouji, Ichihara, all of Japan

[73] Assignee: Chisso Corporation, Osaka, Japan

[21] Appl. No.: 437,635

[22] Filed: Nov. 17, 1989

[30] Foreign Application Priority Data

Dec. 15, 1988 [JP] Japan ................................ 63-317136

[51] Int. Cl.$^5$ .............................................. H05K 3/02
[52] U.S. Cl. .................................... 29/846; 174/259; 174/52.2; 428/901
[58] Field of Search ............... 174/259, 52.2; 428/901; 29/846; 427/96

[56] References Cited

U.S. PATENT DOCUMENTS

| | | | |
|---|---|---|---|
| 2,932,689 | 1/1976 | Watanabe et al. | 179/259 X |
| 3,711,625 | 1/1973 | Dupuis | 174/52.2 X |
| 4,353,954 | 10/1982 | Yamaoka et al. | 174/259 X |
| 4,562,119 | 12/1985 | Darms et al. | 428/901 X |
| 4,662,973 | 5/1987 | Gotou et al. | 174/259 X |
| 4,731,287 | 3/1988 | Noda et al. | 428/901 X |
| 4,839,232 | 6/1989 | Morita et al. | 428/901 X |

FOREIGN PATENT DOCUMENTS

| | | | |
|---|---|---|---|
| 87/02620 | 5/1987 | World Int. Prop. O. | 428/901 |
| 88/02591 | 4/1988 | World Int. Prop. O. | 428/901 |

Primary Examiner—Carl E. Hall
Assistant Examiner—Carl J. Arbes
Attorney, Agent, or Firm—Fred Philpitt

[57] ABSTRACT

A process for producing a cheap carrier tape of a two layer structure having a superior heat resistance, difficultly susceptible of effect of impurities and having a superior flexibility is provided, which process comprising the following steps: coating a polyimide varnish onto a continuous, electrically-conductive metal foil and baking it; punching the resulting tape of a two layer structure of the metal foil and the polyimide film to form sprocket holes; cutting and removing the polyimide film to form a device hole; coating a resist onto the metal foil surface; light-exposing the resulting resist by the medium of a mask for separating a circuit pattern and a circuit from the sprocket parts; developing the resulting resist and etching the metal foil by the medium of a mask of the resist; removing the resist; and plating the metal foil.

1 Claim, 3 Drawing Sheets

PROCESS FOR PRODUCING A CARRIER TAPE

BACKGROUND OF THE INVENTION

1. Field of the Invention

This invention relates to a carrier tape used for assembling semiconductors.

2. Description of Related Art

Conventional carrier tape films include those of two kinds i.e. those of the so-called three layer structure as illustrated in steps (a)–(d) of FIG. 1, obtained by coating an adhesive 2 onto a polyimide film 1, followed by punching sprocket holes 3 and a device hole 4, contact-bonding a copper foil 5 onto the film on heating and forming a lead 6 according to photolithography technique, and those of the so-called two layer structure as illustrated in steps (b)–(d), of FIG. 2, obtained by coating and baking a polyimide varnish 1 onto a copper foil 5, followed by forming a device hole 4 by etching on the polyimide surface 1 according to lithography technique and forming a lead 6 on the copper surface again according to lithography technique.

However, according to the three layer structure as illustrated in FIG. 1, the heat resistance of the adhesive layer ((2) in FIG. 1) placed between the polymide film and the copper foil is inferior to that of the polyimide film; hence deviation of the lead occurs due to heating at the time of inner lead bonding for thermally contact-bonding the lead to IC tip so that rejects are liable to occur.

In particular, as the high integration of IC tip advances, carrier tapes also advance toward increase in the number of pins; thus as the number of pins increases, conventional wire-bonding mode requires a longer bonding time and there is a strong possibility that bonding becomes impossible depending on the number of pins. Thus, a collective bonding mode (TAB mode), using a film carrier has been noted. However, as increase in the number of pins advances, the width of lead pitch also becomes smaller; thus the stability of the dimensional accuracy at the time of bonding has been becoming very important.

In such a situation, since an adhesive layer having a limited heat-resistance is present, deviation or torsion of lead occurs due to deterioration or softening of the adhesive brought about by heat at the time of inner lead bonding so that positioning at the time of bonding becomes difficult or inferior bonding is liable to occur.

In addition, there occur cases that impurities contained in the adhesive induce an erroneous motion of IC or a portion of the adhesive adheres to the sprocket holes to cause the positioning of the lead and the IC tip to get out of order.

On the other hand, there is a carrier tape of a two layer structure without any adhesive layer, having overcome the drawback of the above carrier tape of a three layer structure. As illustrated in (b) to (d) of FIG. 2, the carrier tape of the structure is prepared by coating and baking a polyimide varnish onto a continuour copper foil to form a copper-lined tape of a two layer structure, followed by coating a resist onto the polyimide surface, subjecting the resulting material to light exposure development treatment by the medium of a mask and etching the polyimide film to form a device hole. However, the etching rate of the polyimide film is so low that the product cannot be applied only to a carrier tape of a thin polyimide film. In the case of such a thin polyimide film, the stiffness of the resulting tape is so low that troubles are liable to occur at the subsequent steps requiring stiffness such as etching or plating step of copper foil, and further inner lead bonding step. Further, since the photolithography is added, the steps are so long that the product is economically inferior.

Further, there is a process of forming a thin copper film on a polyimide film by means of an electronic beam deposition, a spatter or a non-electrolysis and electrolysis, but the resulting copper film formed according to the process has an inferior flexibility; hence when a fine lead is formed, the product is liable to be broken when it is handled. In addition, the process is inferior in productivity and economically inferior in the aspect of cost.

SUMMARY OF THE INVENTION

In view of the above-mentioned problems, the object of the present invention is to provide a cheap carrier tape of a two layer structure having a superior heat resistance and difficult to cause an erroneous motion of IC due to impurities.

The present invention resides in a process for producing a carrier tape which comprises a step of coating a polyimide varnish onto a continuous, electrically-conductive metal foil, followed by baking the material;

a step of punching the resulting tape of a two layer structure consisting of said metal foil and polyimide film to form sprocket holes;

a step of cutting and removing said polyimide film by means of a cutting-processing machine to form a device hole;

a step of coating a resist onto the surface of said metal foil;

a step of subjecting the resulting resist to lightexposure by the medium of a mask for separating a circuit pattern and a circuit from the sprocket hole parts;

a step of subjecting the resulting resist to a developing treatment and etching said metal foil by the medium of a mask of said resist;

a step of removing the resist; and a step of plating the resulting metal foil.

Figure 1:
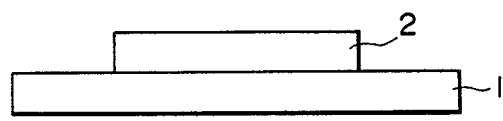
FIGS. 1(a)–1(d) and 2(b)–2(d) show a flow sheet illustrating a process for producing a conventional carrier tape (in side view and cross-sectional view).
Figure 1:
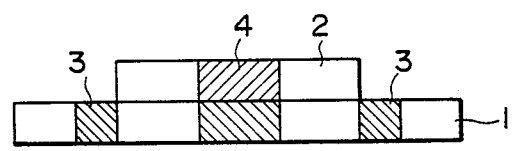
Figure 1:
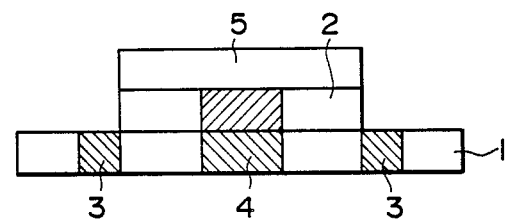
Figure 1:
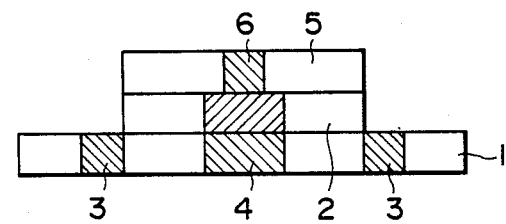
Figure 2:
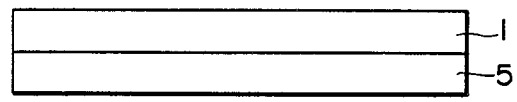
Figure 2:
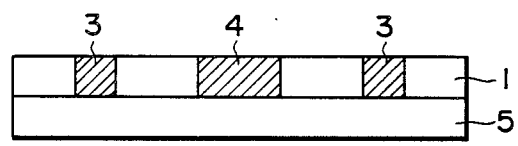
Figure 2:
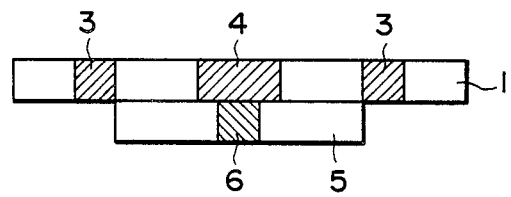

In these figures,

1: polyimide film
2: adhesive layer
3: sprocket hole
4: device hole
5: copper foil
6: lead

DETAILED DESCRIPTION OF PREFERRED EMBODIMENTS

Figure 3A:
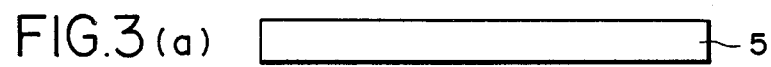
FIGS. 3(a)–3(e) show a flow sheet illustrating a process for producing a carrier tape of the present invention.
Figure 3B:
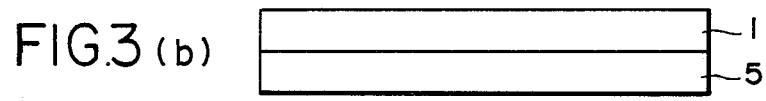
Figure 3C:
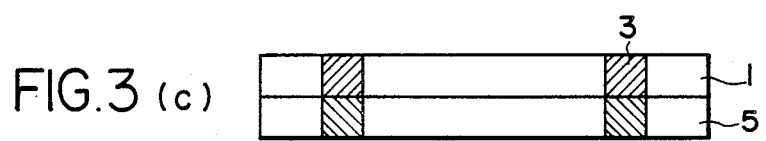
Figure 3D:
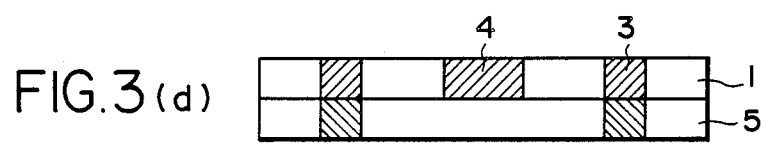
Figure 3E:
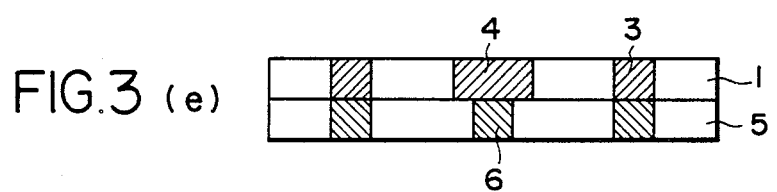

In order to solve the above-mentioned problems, the present invention is carried out as illustrated in FIG. 3 ((a), (b), (c), (d) and (e)).

Namely, a polyimide varnish is coated directly onto a copper foil 5 without using any adhesive, followed by baking to form a polyimide film 1; punching the resulting copper-lined sheet of a two layer structure to form sprocket holes 3; thereafter forming a device hole 4 by means of a cutting-processing machine; coating a resist onto the copper foil; subjecting the resulting resist to light exposure treatment by the medium of a mask for separating a circuit pattern and a circuit from the sprocket holes, etching the metal foil, removing the resist to form a lead 6 and plating the metal foil to form a cheap carrier tape having a superior heat resistance, hardly susceptible to the effect of impurities and having a good flexibility of lead.

As the cutting-processing machine for forming the device hole necessary for displaying the effectiveness of the present invention, a numeral value-controllable, numeral value-controlling robot as a kind of numeral value-controlling machines is exemplied, and in the classification of control mode, a servocontrolling robot is exemplified, while in the classification of operation mechanism, a perpendiculr coordinate robot is exemplified.

In an example of the production process, a varnish is coated onto a copper foil cut to a definite width so as to give a definite thickness. A polyimide precursor varnish used herein is preferably a varnish having a superior adhesion to copper foil as disclosed in Japanese patent application laid-open No. Sho 61287926/1986.

This varnish is a solution of a silicon-containing polyamic acid prepared by reacting a tetracarboxylic dianhydride (A mols) expressed by the formula (I), a diamine (B mols) expressed by the formula (2) and an aminosilicon compound (C mols) so as to cause the expressions (4) and (5) to come into existence, and having an intrinsic viscosity of 0.05 to 5 dl/g, measured at 30±0.01° C. in a solvent as exemplified later and in a concentration of 0.5% by weight therein:

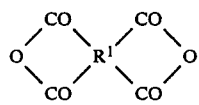  (1)

$NH_2-R^2-NH_2$  (2)

$NH_2-R^3-SiR_3^4-kX_k$  (3)

$1 \leq \dfrac{C}{A-B} \leq 1.8$  (4)

$0.1 \leq \dfrac{C}{B+C}$  (5)

In the formulas (1), (2) and (3), $R^1$ represents a tetravalent, carbocyclic, aromatic group; $R^2$ represents an aliphatic group of 2 to 12 carbon atoms, an alicyclic group of 4 to 30 carbon atoms, an araliphatic group of 6 to 30 carbon atoms, a carbocyclic aromatic group of 6 to 30 carbon atoms, a polysiloxane group expressed by the formula (6)

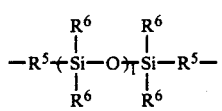  (6)

wherein $R^5$ independently represents

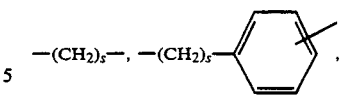

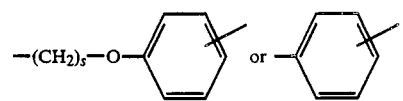

wherein s represents an integer of 1 to 4, $R^6$ independently represents an alkyl group of 1 to 6 carbon atoms, phenyl group or an alkyl- substituted phenyl group of 7 to 12 carbon atoms and l represents a value of $1 \leq l \leq 100$, or a group expressed by the formula

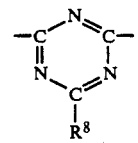

wherein $R^8$ represents an aliphatic group of 8 or less carbon atoms, an araliphatic group or hydrogen atom; $R^3$ represents $-(CH_2)_s$-,

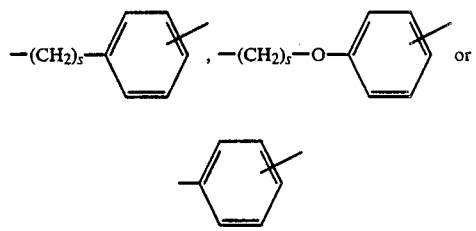

wherein s represents an integer of 1 to 4 carbon atoms; $R^4$ independently represents an alkyl group of 1 to 6 carbon atoms, phenyl group or an alkyl-substituted phenyl group of 7 to 12 carbon atoms; X indepndently represents an alkoxy group, acetoxy group or a halogen atom; and k represents a value of $1 \leq k \leq 3$.

Examples of the solvent of the above solution are N-methyl-2-pyrrolidone, N,N-dimethylacetamide, N,N-dimethylformamide, dimethyl sulfoxide, tetramethylurea, pyridine, dimethyl sulfone, hexamethylphosphoroamide, methylformamide, N-acetyl-2-pyrrolidone, toluene, xylene, methyl cellosolve, ethyl cellosolve, butyl cellosolve, diethylene glycol monomethyl ether, diethylene glycol dimethyl ether, cyclopentanone, cyclohexanone, mixtures of the foregoing.

Copper foil coated with a varnish is cured at a definite temperature, followed by punching sprocket holes by a punching means, carrying out positioning of the sprocket holes and a device hole, and cutting the polyimide layer into a definite shape by means of a numeral value-controlling machine to form a device hole.

Next, a resist is coated onto the copper foil surface, followed by subjecting the resulting surface to light exposure by the medium of a mask for separating a circuit pattern and a circuit from sprocket hole par&s, forming a circuit pattern on the copper foil by etching, removing the resist and plating tin or gold on the copper surface to obtain a carrier tape.

According to the present invention, by employing the above-mentioned construction, it is possible to obtain a cheap carrier tape having a superior heat resistance, hardly susceptible to the effect of impurities and a superior flexibility.

What we claim is:

1. A process for producing a carrier tape which comprises the steps of
    (a) coating a polyimide varnish onto one surface of a continuous, electrically-conductive metal foil, followed by baking the thus coated foil;
    (b) punching the resulting tape comprising a two layer structure consisting of said metal foil and polyimide film to form sprocket holes;
    (c) cutting and removing a portion of said polyimide film by means of a cutting-processing machine to thereby form a device hole;
    (d) coating a resist onto the other surface of said metal foil;
    (e) subjecting the resulting resist to light-exposure by the medium of a mask for separating a circuit pattern and a circuit from said sprocket holes;
    (f) subjecting the resulting resist to a developing treatment and etching said metal foil by the medium of a mask of said resist;
    (g) removing said resist; and
    (h) plating the resulting metal foil.

* * * * *